United States Patent
Leighton et al.

(10) Patent No.: US 6,777,791 B2
(45) Date of Patent: Aug. 17, 2004

(54) MULTIPLE GROUND SIGNAL PATH LDMOS POWER PACKAGE

(75) Inventors: Larry Leighton, Scottsdale, AZ (US); Tom Moller, Gilroy, CA (US); Bengt Ahl, Gavle (SE); Henrik Hoyer, Los Gatos, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/119,559

(22) Filed: Apr. 10, 2002

(65) Prior Publication Data

US 2002/0140071 A1 Oct. 3, 2002

Related U.S. Application Data

(63) Continuation-in-part of application No. 09/493,298, filed on Jan. 28, 2000, now abandoned.

(51) Int. Cl.[7] ............................................. H01L 23/02
(52) U.S. Cl. ....................... 257/678; 257/691; 257/724; 257/725
(58) Field of Search ................................ 257/678, 691, 257/724–728

(56) References Cited

U.S. PATENT DOCUMENTS 6,137,168 A * 10/2000 Kirkman .................... 257/691
6,501,157 B1 * 12/2002 Cobbley .................... 257/669
6,501,664 B1 * 12/2002 Krieger ..................... 361/782
6,507,111 B2 * 1/2003 Shimizu .................... 257/728

FOREIGN PATENT DOCUMENTS

JP          04277665 A   * 10/1992   ........... H01L/23/32

* cited by examiner

*Primary Examiner*—Long Pham
*Assistant Examiner*—Nathan W. Ha
(74) *Attorney, Agent, or Firm*—Baker Botts L.L.P.

(57) ABSTRACT

A laterally diffused metal oxide semiconductor (LDMOS) power package includes a conductive mounting flange mounted on a heat sink and electrically connected to a dielectric substrate of a printed circuit board. A plurality of transistors are mounted on the top surface of the mounting flange. Each of the transistors has an input terminal, an output terminal, and a ground terminal, with the ground terminal of each transistor being electrically coupled to the top surface of the mounting flange. A plurality of parallel ground signal return paths are provided to electrically couple the top surface of the mounting flange to the dielectric substrate, thereby reducing resistance and inductance in the ground signal path and increasing the efficiency of the power package.

21 Claims, 6 Drawing Sheets

MULTIPLE GROUND SIGNAL PATH LDMOS POWER PACKAGE

RELATED APPLICATIONS

This application is a Continuation-in-Part of U.S. patent application Ser. No. 09/493,298 filed Jan. 28, 2000 now abandoned.

BACKGROUND OF THE INVENTION

1. Technical Field of the Invention

The present invention pertains generally to the field of radio frequency (RF) power transistor devices and, more specifically, to techniques for providing ground signal paths in a laterally diffused metal oxide semiconductor (LDMOS) power transistor package assembly.

2. Description of Related Art

The use of RF power transistor devices as signal amplifiers in wireless communication applications is well known. With the considerable recent growth in the demand for wireless services, such as personal communication services, the operating frequency of wireless networks has increased dramatically and is now well into the gigahertz frequencies. At such high frequencies, laterally diffused, metal oxide semiconductor (LDMOS) transistors have been preferred for power amplification applications, e.g., for use in antenna base stations.

A typical LDMOS power package generally comprises a plurality of electrodes formed on a semiconductor die, each electrode comprising a plurality of transistors. The individual transistors of each electrode are connected to respective common input (gate) and output (drain) terminals formed on the surface of the die. A common ground (source) terminal substrate is formed on the underlying side of the die. The die is attached, e.g., by a known eutectic die attach process, to a metal flange serving as a combined ground current reference, heat spreader and mounting device for the package. A thermally conductive, but electrically isolating, e.g., aluminum oxide, "window" substrate is attached to the flange, surrounding the die. Respective input and output lead frames are attached, e.g., at opposing ends, to a top surface of the window substrate, electrically isolated from the flange.

The input and output lead frames are coupled to the respective electrode input and output terminals via respective input and output transmission paths, which may also include one or more impedance matching elements interposed between the respective lead frames and electrode terminals.

Impedance matching between circuit elements external to the power package and the respective electrode terminals on the die is crucial to proper operation, especially at high operating frequencies. Another crucial factor is providing a uniform ground potential for the power package and the surrounding circuitry.

By way of illustration, FIG. 1 is a simplified schematic of a known LDMOS power transistor device 10. The device 10 comprises a plurality of parallel transistors 12, having a common input (gate) lead 14, a common output (drain) lead 16, and a common ground (source) 18 through an underlying substrate.

FIGS. 2–3 depict a power package 20 employing such an LDMOS device 10 and mounted in a cut-away area 36 of a heat sink 22, e.g., as part of an amplifier circuit. The power package 20 includes a mounting flange 26 attached to the heat sink 22 by a pair of mounting screws 24. A single layer printed circuit (PC) board 28 is also secured to the heat sink 22, substantially surrounding the power package 20. The PC board 28 includes a conductive top surface 30, a layer of dielectric material 32, and a conductive bottom surface 34, respectively. The bottom surface 34 and attached heat sink 22 form a reference ground plane for both the LDMOS device 10, which is attached to the top surface 27 of the mounting flange 26, and other amplifier circuit elements (not shown) located on the top PC board surface 30.

A dielectric substrate 38 is attached to the top surface 27 of the mounting flange 26, the substrate 38 defining a window surrounding an exposed area of the top surface of the flange where LDMOS device 10 is attached. Respective bond wires 40 and 42 extend from the input (gate) and output (drain) terminals (14) and (16) of the LDMOS device 10 to respective input and output lead frames 44 and 46 attached to the window substrate 38. The input and output lead frames 44 and 46 extend from opposite sides of the substrate 38, and are connected by respective solder welds 48 and 50 to corresponding conductive paths 31 and 33 formed on the top surface 30 of the PC board 28.

Notably, the power package 20 depicted in FIGS. 2–3 is simplified, in that impedance matching elements commonly inserted in the transmission path between the respective leads 44 and 46 and electrode terminals (14) and (16) are omitted. Further, the power package 20 will normally have a protective cover, which is also omitted for ease in illustration.

FIG. 4 depicts the current signal paths through the PC board 28 and power package 20. An input signal 52 flows between input matching elements (not shown) and the package input lead 44, via a first conductive path formed in the top layer 30 of the PC board 28 and the solder weld 48. Similarly, an output signal 54 flows between output matching elements (not shown) and the package output lead 46, via a second conductive path formed in the top PC board layer 30 and the solder weld 50. A ground signal 56 flows from the ground terminal (18) underlying the device 10, in all directions across the top surface 27 and down the sides 58, respectively, of the mounting flange 26, across a peripheral surface 60 of the cut-away area 36 of the heat sink 22, back up the sides 59 of the cut-away area 36, and then through the bottom layer 34 of the PC board 28.

In such high frequency amplifier applications, there can be a significant amount of current. Because of the path losses for these currents, there is a voltage drop created, which causes signal loss, decreased efficiency, and reduces isolation between ports.

Thus, it would be desirable to provide an LDMOS power package with an improved ground signal path, especially for use with multi-layer PC board applications.

SUMMARY OF THE INVENTION

In accordance with the present invention, an LDMOS power package is provided with multiple ground signal paths. In a preferred embodiment, the power package includes a conductive mounting flange, with a dielectric substrate attached to the mounting flange. An inner surface of the substrate defines a window exposing a portion of the mounting flange. A silicon die is attached to the exposed portion of the mounting flange, the die having a plurality of transistors formed thereon, the transistors having respective input, output and ground terminals, the ground terminal electrically coupled to the mounting flange. An input lead frame is attached to the top surface of the substrate, isolated from the flange, and electrically coupled to the respective transistor input terminals. An output lead frame is attached to the substrate, isolated from the flange, and electrically coupled to the respective transistor output terminals. A ground lead frame is attached to the substrate, wherein the input, output and ground leads are electrically isolated from one another.

In another aspect, the present invention is directed to an LDMOS power package that includes a conductive mounting flange mounted on a heat sink and electrically connected to a dielectric substrate of a printed circuit board. A plurality of transistors are mounted on the top surface of the mounting flange. Each of the transistors has an input terminal, an output terminal, and a ground terminal, with the ground terminal of each transistor being electrically coupled to the top surface of the mounting flange. A plurality of parallel ground signal return paths electrically couple the top surface of the mounting flange to the dielectric substrate.

In another aspect, the present invention is directed to an assembly that includes a heat sink; a printed circuit (PC) board having a top conductive surface and a dielectric substrate coupled to the heat sink to form a reference ground plane; and a laterally diffused metal oxide semiconductor (LDMOS) power package. The power package includes a conductive mounting flange mounted on the heat sink and connected to the dielectric substrate. A plurality of transistors are mounted on a top surface of the mounting flange. Each of the transistors has an input terminal, an output terminal, and a ground terminal, with the ground terminal of each transistor being electrically coupled to the top surface of the mounting flange. A plurality of parallel ground signal return paths are provided to electrically couple the top surface of the mounting flange to the dielectric substrate.

As will be apparent to those skilled in the art, other and further aspects and advantages of the present invention will appear hereinafter.

BRIEF DESCRIPTION OF THE DRAWINGS

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figure 5:
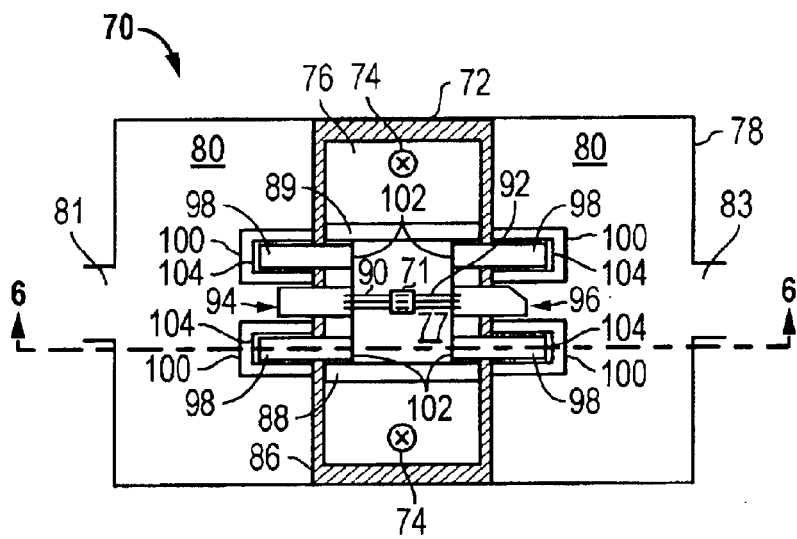
FIG. 5 is a top view of a first preferred electrical assembly provided in accordance with the invention, including a preferred LDMOS power package secured to a heat sink, with a single layer printed circuit board attached to the heat sink and surrounding the power package.
Figure 6:
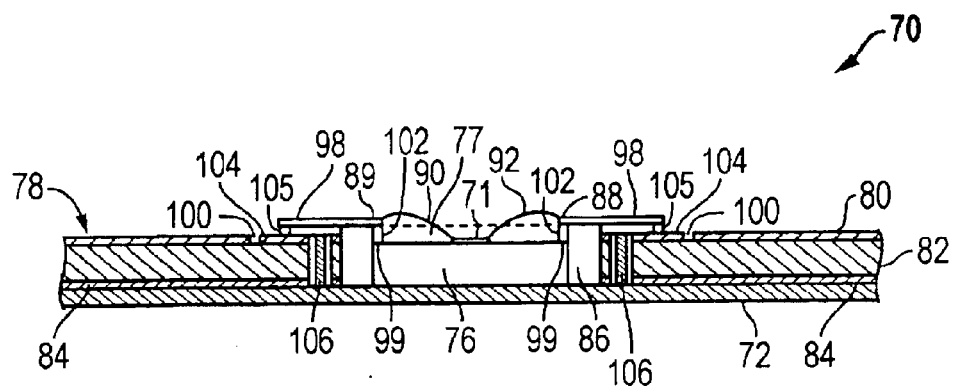
FIG. 6 is a partially cut-away side view of the assembly of FIG. 5 taken along line 6—6.

FIGS. 5–6 depict a preferred electrical assembly, including an LDMOS power package 70 mounted in a cut-away area 86 of a heat sink 72, e.g., as part of an amplifier circuit. The power package 70 includes a mounting flange 76 attached to the heat sink 72 by a pair of mounting screws 74. A single layer printed circuit (PC) board 78 is also secured to the heat sink 72, substantially surrounding the power package 70. The PC board 78 includes a conductive top surface 80, at least one layer of dielectric material 82, and a conductive bottom surface 84, respectively. The bottom PC board surface 84 and attached heat sink 72 form a reference ground plane for an LDMOS power device formed in a silicon die 71 attached to the top surface 77 of the mounting flange 76. The bottom PC board surface 84 and heat sink 72 are also a reference ground plane for other amplifier circuit elements (not shown) located on the top PC board surface 80.

A dielectric window substrate 88 is attached to the top surface 77 of the mounting flange 76, the substrate 88 defining a window surrounding an exposed area of the top surface of the flange 77 in which the die 71 is attached. Respective pluralities of bond wires 90 and 92 extend from input (gate) and output (drain) terminals located on the die 71 to respective input and output lead frames 94 and 96 attached to a top surface 89 of the window substrate 88. The input and output lead frames 94 and 96 extend from opposite sides of the substrate 88, and are connected by respective solder welds (not shown) to corresponding conductive paths 81 and 83 formed on the top surface 80 of the PC board 78.

In accordance with a first aspect of the invention, the package 70 further includes a plurality of ground lead frames 98, which are attached to, and extend from, the top surface 89 of the window substrate 88. Each ground lead frame 98 is electrically coupled to a corresponding conductive ground pad 104 formed in the top surface 80 of the PC board 78 by a respective solder bond 105. In particular, the conductive ground pads 104 are isolated from the respective amplifier circuit paths 81 and 83 by removal of a strip 100 of the conductive top surface 80 of the PC board 78 surrounding each ground pad 104.

Each ground lead frame 98 is electrically coupled to the flange surface 77 by a respective metalized path 102 formed on an inner perimeter wall 99 of the window substrate 88. In this manner, an additional ground signal path is formed from the flange surface 77, through the respective metalized paths 102 and ground lead frames 98, to the respective ground pads 104. A respective metal plated via extends from each ground pad 104 to the bottom PC board surface 84, electrically coupling the ground pad 104 to the heat sink 72.

Figures 1, 2, 3:
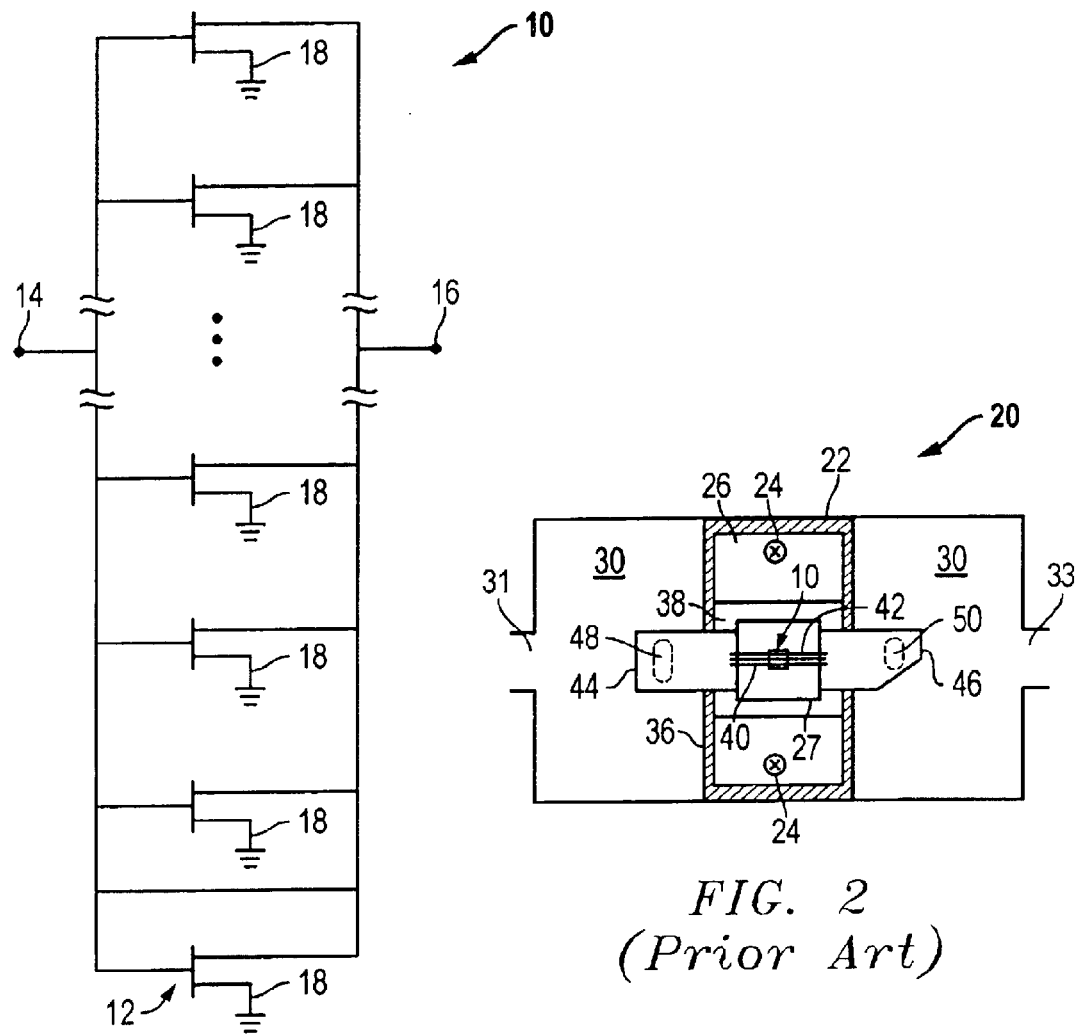
FIG. 1 is a simplified schematic illustration of a known LDMOS power transistor device.
FIG. 2 is a top view of a prior art electrical assembly including an LDMOS power package secured to a heat sink, with a printed circuit board attached to the heat sink and surrounding the power package.
FIG. 3 is a partially cut-away side view of the assembly of FIG. 2 secured to a heat sink, with a printed circuit board attached to the heat sink and surrounding the power package.
Figure 4:
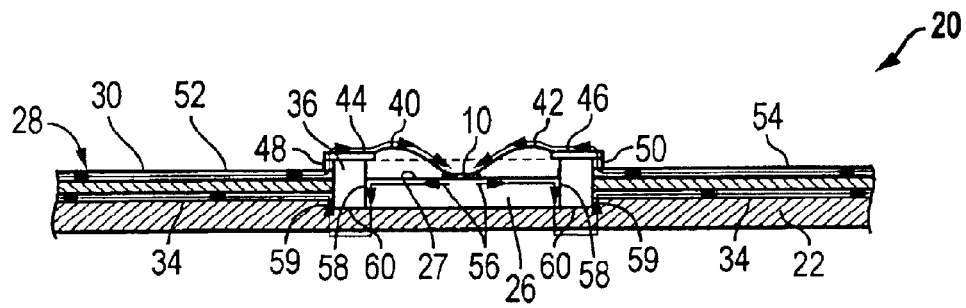
FIG. 4 depicts the input, output and ground return signal paths through the power package in the assembly of FIGS. 2–3.

As with the prior art package 20 depicted in FIGS. 1–2, the preferred power package 70 has been simplified for ease in illustration, wherein respective impedance matching elements commonly inserted in the transmission path between the respective lead frames 94 and 96 and the die 71 have been omitted. Further, although the power package 70 is shown with four ground lead frames 98, as will be apparent to those skilled in the art, a fewer or greater number my be used, depending on design and application considerations.

Figure 7:
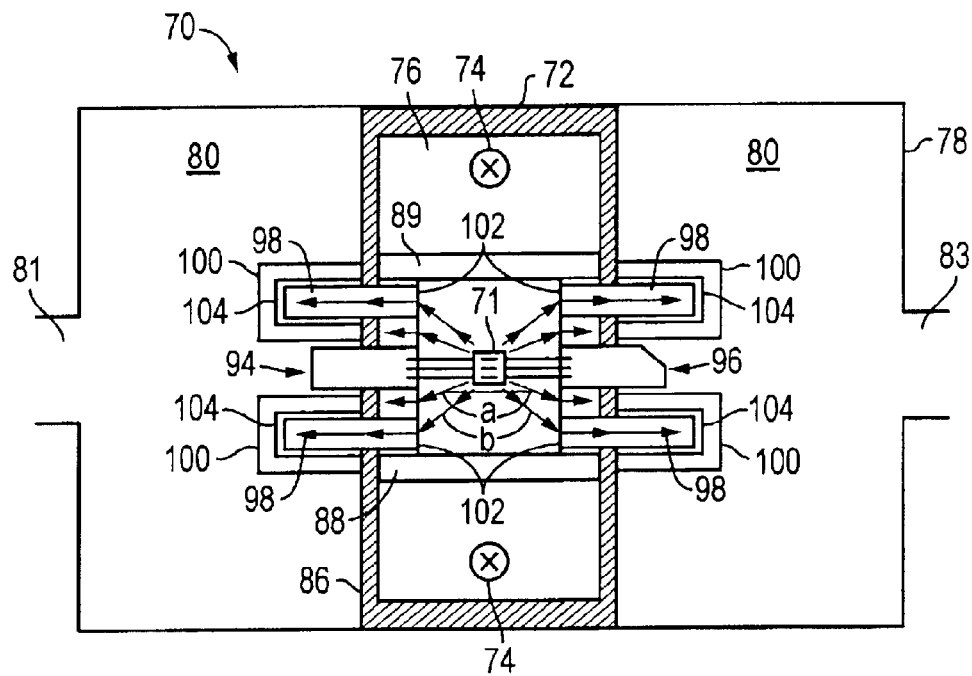
FIG. 7 is a top view of the assembly of FIG. 5 depicting a plurality of ground return signal paths through the power package assembly of the present invention.

FIG. 7 is a top view of the assembly of FIG. 5 depicting a plurality of ground return signal paths through the power package assembly of the present invention. Paths "a" and "b" are illustrated, and are further described in connection with FIG. 8 below.

Figure 8:
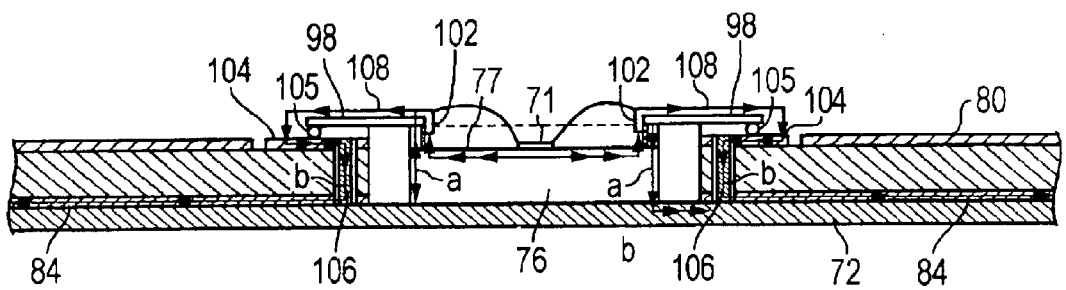
FIG. 8 is a partially cut-away side view of the assembly of FIG. 6 depicting the plurality of ground return signal paths through the power package assembly of the present invention.

FIG. 8 is a partially cut-away side view of the assembly of FIG. 6 depicting the plurality of ground return signal paths through the power package assembly of the present invention. With reference to FIGS. 7 and 8, the multiple ground signal paths of the present invention will now be described. Paths "a" follow the conventional ground signal path across the top surface and down the sides of the mounting flange 76, and across the bottom surface of the cut-away area 86 of the heat sink 72. The paths "a" then follow a metal plated via 106 to the bottom layer 84 of the PC board 78. Paths "b" travel across the top surface of the mounting flange 76 to metalized paths 102 where they travel upward in two potential paths to ground lead frames 98. They then pass through solder bonds 105 to the ground pads 104. The paths "b" may then pass through the metal plated via to the bottom layer 84 of the PC board. Alternatively, an extension of the heat sink metal may be used for the new paths "b" in place of the metal plated via.

By providing additional ground return signal paths in parallel with the conventional path, losses due to "skin effect" are significantly reduced. Skin effect is the tendency for current to flow along the surface of a conductor instead of flowing throughout the conductor. Skin effect causes an increase in resistance and inductance with increasing frequency, and can cause a serious degradation in performance at the frequencies utilized by LDMOS power amplifiers. In addition, since there is a linear relationship between the length of a current path at high frequencies and the losses due to skin effect, the present invention also realizes increased performance by reducing the lengths of the ground signal paths.

Figure 9:
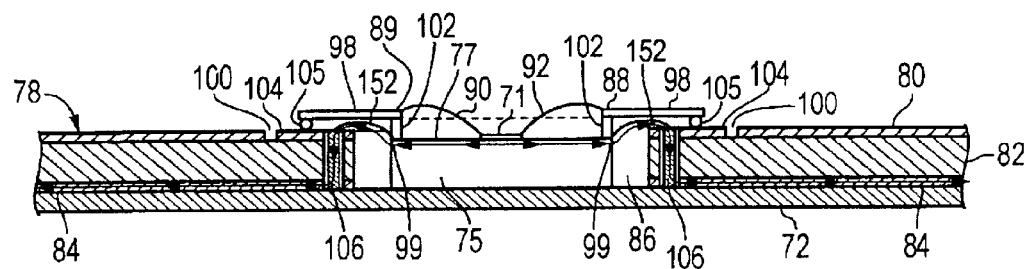
FIG. 9 is a partially cut-away side view of the assembly of FIG. 6 with a plurality of bond wires added to electrically couple the flange surface directly to the via, creating a further ground return signal path across the cut-away area of the heat sink in another embodiment of the present invention.

FIG. 9 is a partially cut-away side view of the assembly of FIG. 6 with a plurality of bond wires 152 added to electrically couple the flange surface 77 directly to the metal plated via 106 (or alternatively to an extension of the heat sink metal), thereby creating additional ground return signal paths "c" across the cut-away area 86 of the heat sink in another embodiment of the present invention. The additional ground return signal paths "c" may be provided in place of, or in parallel with, the conventional path and the additional paths "a" and "b" illustrated in FIG. 8. Additionally, it should be noted that the path "c" created by bond wires 152 is considerably shorter than the other ground signal paths, thereby providing a further reduction in losses due to skin effect.

Figure 10:
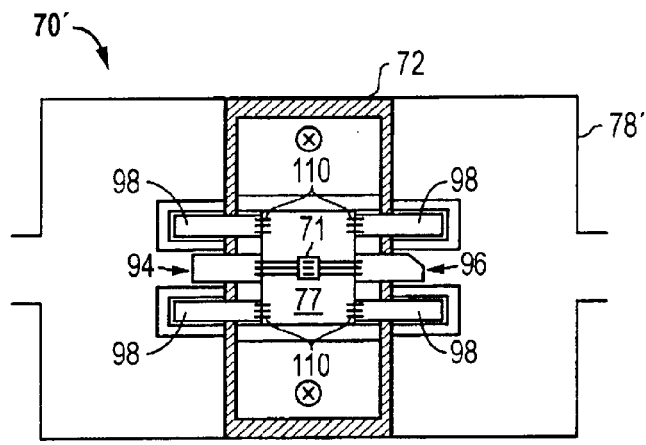
FIG. 10 is a top view of a further preferred electrical assembly provided in accordance with the invention, including an alternate preferred LDMOS power package secured to a heat sink, with a multi-layer printed circuit board attached to the heat sink and surrounding the power package.
Figure 11:
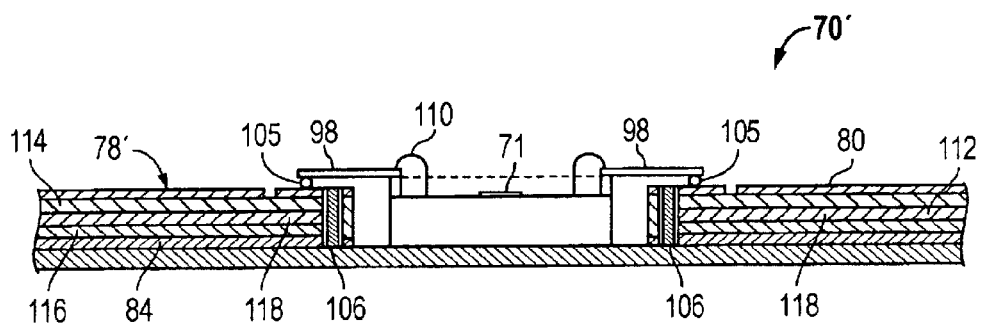
FIG. 11 is a partially cut-away side view of the assembly of FIG. 10.

FIGS. 10–11 depict an alternate preferred electrical assembly provided in accordance with the invention, including an alternate preferred LDMOS power package (designated as 70') secured to a heat sink 72 adjacent a multi-layer PC board (designated as 78').

The features and characteristics of power package 70' are nearly identical to those of package 70, except that respective pluralities of bond wires 110 are used to electrically couple the ground lead frames 98 to the top surface 77 of the flange 72 instead of the metalized paths 102.

Along with the respective top and bottom conductive surfaces 80 and 84, the multi-layer PC board 78' includes at least one additional conductive layer 112 positioned between first and second dielectric middle layers 114 and 116. In order to isolate the middle layer 112 from the ground signal, a gap 118 is left open between the layer 112 and each conductive via 106. In still further alternate preferred assemblies (not shown), it may be desirable to electrically couple the vias 106 to multiple different ground planes within a multi-layer pc board.

Figure 12:
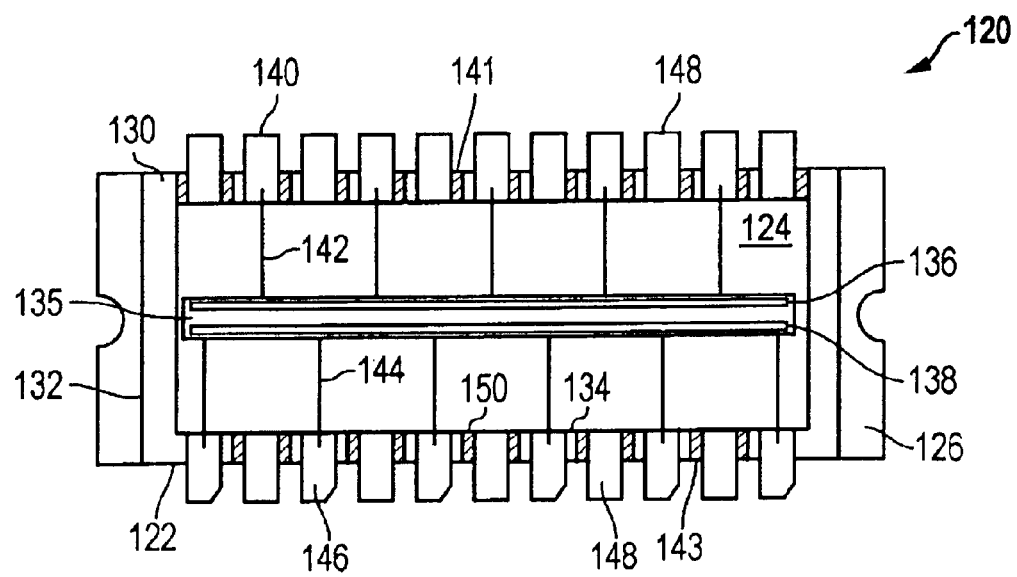
FIG. 12 is a top view of a still further preferred LDMOS power package, constructed in accordance with the invention.
Figure 13:
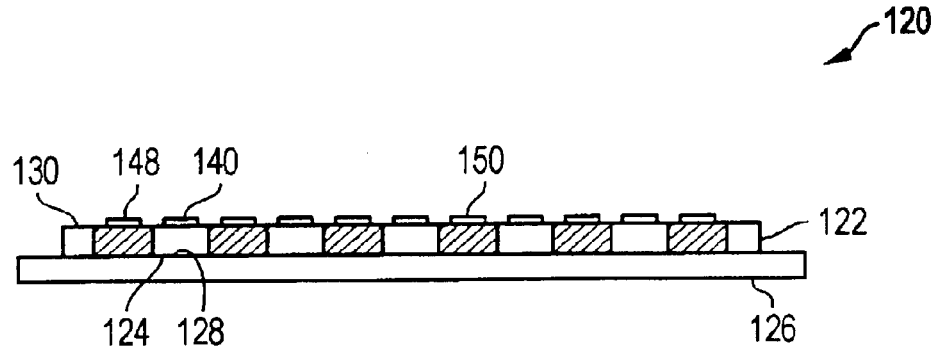
FIG. 13 is a side elevation of the power package of FIG. 12.

Referring to FIGS. 12–13, a still further preferred power package 120 includes a dielectric window substrate 122 attached to a top surface 124 of a conductive mounting flange 126. In particular, the window substrate has a bottom surface 128 attached to the mounting flange 126, a top surface 130, an outer surface 132, and an inner surface 134, the inner surface 134 defining a window exposing a portion of the mounting flange surface 124.

An elongate silicon die 135 is attached to the exposed portion of the mounting flange surface 124 within the window substrate 122, the die 135 having a plurality of electrodes formed thereon (not shown), having common input (gate) and output (drain) terminals 136 and 138. The electrode input terminals 136 are coupled by a plurality of input bond wires 142 to a plurality of input lead frames 140, which are attached in a spaced apart relationship to the top surface 130 of a first side 141 of the window substrate 122. The electrode output terminals 138 are coupled by a plurality of output bond wires 144 to a plurality of output lead frames 146, which are attached in a spaced apart relationship to the top surface 130 of a second side 143 of the window substrate 122, opposite the first side 141.

The electrodes are also coupled to a common ground terminal (not shown) located on an underside of the die 135 and electrically coupled to the flange 126. In accordance with the invention, a plurality of ground lead frames 148 are attached to the top surface 130 of both sides 41 and 43 of the window substrate 122, interleaved between respective input and output lead frames 140 and 146. As best seen in FIG. 11, each ground lead frame 148 is electrically coupled to the flange surface 124 by a respective metalization layer 150 formed on the outer surface 132, inner surface 134 or both, of the window substrate 122. The respective metalization layers 150 and ground lead frames 148 remain isolated from the input and output lead frames 140 and 146.

Figure 14:
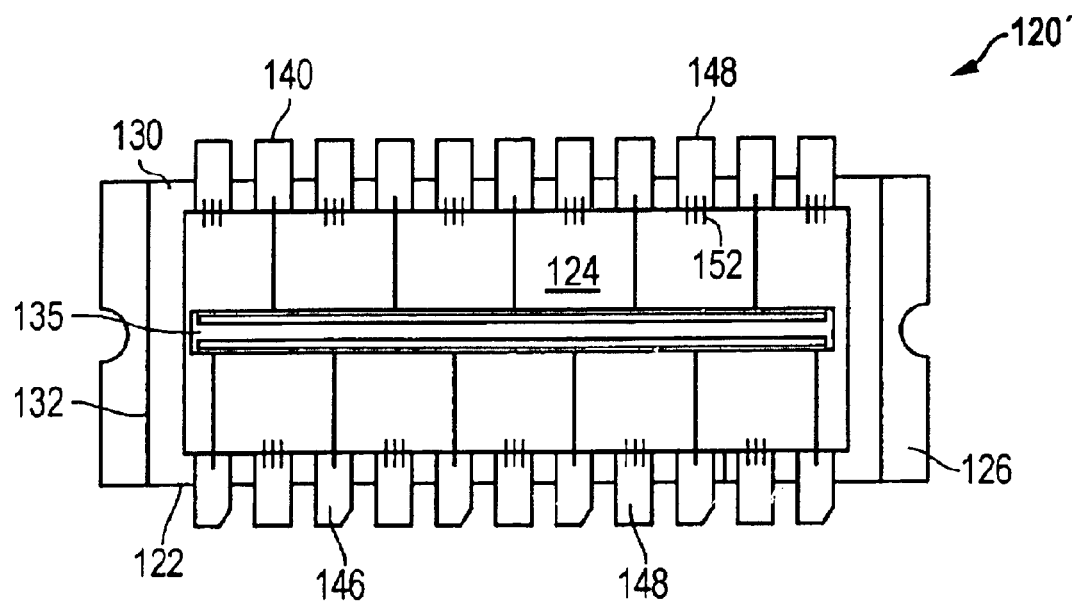
FIG. 14 is a top view of a yet another preferred LDMOS power package, constructed in accordance with the invention.

Referring to FIG. 14, in an alternate preferred embodiment of the power package (designated 120'), respective pluralities of bond wires 152 may be used to electrically couple the respective ground lead frames 148 to the top surface 124 of the flange 126 instead of the metalized paths 150.

Figure 15:
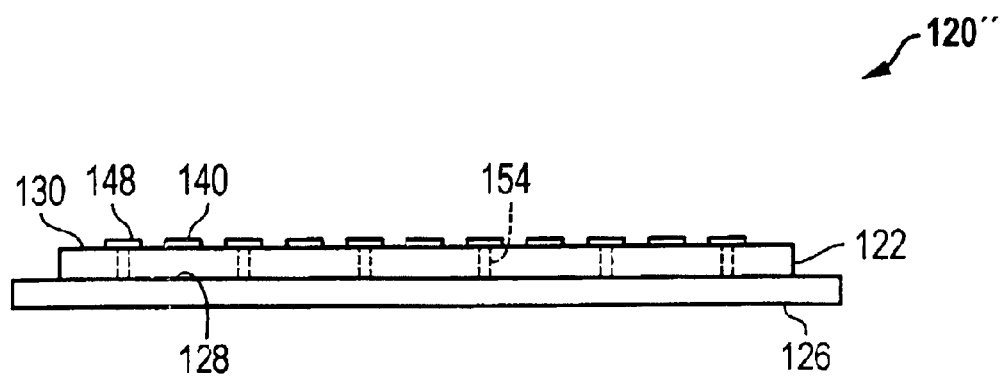
FIG. 15 is a side elevation of still another preferred LDMOS power package, constructed in accordance with the invention.

Referring to FIG. 15, in yet another preferred embodiment of the power package (designated 120"), respective metal plated vias extending from the top surface 130 to the bottom surface 128 of the window substrate 126 are used to electrically couple the respective ground lead frames 148 to the top surface 124 of the flange 126.

As will be apparent to those skilled in the art, in still further preferred embodiments (not shown), the conductive path between the flange 126 and the respective ground lead frames 148 may be any combination of one or more metalization layers 150, bond wires 152 or conductive vias 154.

While preferred embodiments and applications of an LDMOS power package with multiple ground signal paths have been shown and described, as would be apparent to those skilled in the art, many modifications and applications are possible without departing from the inventive concepts herein.

Thus, the scope of the disclosed invention is not to be restricted except in accordance with the appended claims.

What is claimed is:

1. A laterally diffused metal oxide semiconductor (LDMOS) power package comprising:
a conductive mounting flange mounted on a heat sink and electrically connected to a dielectric substrate of a printed circuit (PC) board, said mounting flange having a top surface;
a plurality of transistors mounted on the top surface of the mounting flange, each of said transistors having an input terminal, an output terminal, and a ground terminal, said ground terminal of each transistor being electrically coupled to the top surface of the mounting flange;
a first ground signal return path electrically coupling the top surface of the mounting flange to the dielectric substrate; and
a second ground signal return path electrically parallel to the first path and physically isolated therefrom, said second path electrically coupling the top surface of the mounting flange to the dielectric substrate;
wherein, said second ground signal return path reduces losses associated with the first path caused by resistance due to skin effect.

2. The LDMOS power package of claim 1 wherein the conductive mounting flange includes sides that extend downward through the PC board to the dielectric substrate and the heat sink, and the first ground signal return path extends from the ground terminal of each transistor, across the top surface of the mounting flange, down the sides of the mounting flange, and through the dielectric substrate.

3. The LDMOS power package of claim 2 wherein the PC board includes a conductive top surface that carries input signals to the input terminals of the transistors, and carries output signals from the output terminals of the transistors, and the LDMOS power package further comprises:
at least one ground lead frame electrically coupling the top surface of the mounting flange to a ground pad formed in tile top surface of the PC board, said ground pad being electrically isolated from the top surface of the PC board by an area surrounding the ground pad in which the top surface of the PC board has been removed; and
a conductive via extending downward through the PC board and electrically coupling the ground pad to the dielectric substrate.

4. The LDMOS power package of claim 3 wherein the second ground signal return path extends from the ground terminal of each transistor, across the top surface of the mounting flange, through the ground lead frame, through the ground pad, and through the conductive via to the dielectric substrate.

5. The LDMOS power package of claim 4 wherein the PC board is cut away in an area surrounding the conductive mounting flange, and the conductive via is adjacent the cut-away area and separated from the mounting flange by the cut-away area, and the LDMOS power package further comprises at least one bond wire spanning the cut-away area, and electrically coupling the top surface of the mounting flange directly to the conductive via.

6. The LDMOS power package of claim 5 further comprising a third ground signal return path in parallel with the first and second paths, said third path extending from the ground terminal of each transistor, across the top surface of the mounting flange, through the bond wire, and through the conductive via to the dielectric substrate.

7. The LDMOS power package of claim 2 wherein the PC board includes a conductive top surface that carries input signals to the input terminals of the transistors, and carries output signals from the output terminals of the transistors, and the LDMOS power package is mounted on a metal heat sink, said power package further comprising:
at least one ground lead frame electrically coupling the top surface of the mounting flange to a ground pad formed in the top surface of the PC board, said ground pad being electrically isolated from the top surface of the PC board by an area surrounding the ground pad in which the top surface of the PC board has been removed; and
an extension of the metal heat sink extending upward through the PC board and electrically coupling the ground pad to the metal heat sink.

8. The LDMOS power package of claim 7 wherein the second ground signal return path extends from the ground terminal of each transistor, across the top surface of the mounting flange, through the ground lead frame, through the ground pad, and through the extension of the heat sink to the metal heat sink.

9. The LDMOS power package of claim 8 wherein the PC board is cut away in an area surrounding the conductive mounting flange, and the conductive via is adjacent the cut-away area and separated from the mounting flange by the cut-away area, and the LDMOS power package further comprises at least one bond wire spanning the cut-away area, and electrically coupling the top surface of the mounting flange directly to the extension of the metal heat sink.

10. The LDMOS power packing of claim 9 further comprising a third ground signal return path in parallel with the first and second paths, said third path extending from the ground terminal of each transistor, across the top surface of the mounting flange, through the bond wire, and through the extension of the heat sink to the metal heat sink.

11. A laterally diffused metal oxide semiconductor (LDMOS) power package comprising:
a mounting flange mounted on a metal heat sink in a printed circuit (PC) board, said mounting flange having a conductive top surface and conductive sides electrically coupled to the heat sink;
a plurality of transistors mounted on the top surface of the mounting flange, each of said transistors having an input terminal, an output terminal, and a ground terminal, said ground terminal of each transistor being electrically coupled to the top surface of the mounting flange, said top surface and sides of the mounting flange thereby providing a first ground signal return path from the transistors to the heat sink; and means for providing a second ground signal return path that is electrically parallel to the first return path and physically isolated therefrom, said second path reducing losses associated with the first path caused by resistance due to skin effect.

12. The LDMOS power package of claim 11 wherein the means for providing a second ground signal return path includes:
   a conductive via electrically isolated from a top surface of the PC board and extending through the PC board to a dielectric substrate and the heat sink; and
   at least one bond wire electrically coupling the top surface of the mounting flange to the conductive via, thereby providing the second ground signal return path.

13. The LDMOS power package of claim 11 wherein the means for providing a second ground signal return path includes:
   an extension of the metal heat sink electrically isolated from a top surface of the PC board and extending through the PC board from the heat sink; and
   at least one bond wire electrically coupling the top surface of the mounting flange to the extension of the metal heat sink, thereby providing the second ground signal return path.

14. An assembly, comprising:
   a conductive metal heat sink;
   a printed circuit (PC) board having a dielectric substrate coupled to the heat sink to form a reference ground plane, and a top conductive surface; and
   a laterally diffused metal oxide semiconductor (LDMOS) power package, the power package comprising:
      a conductive mounting flange mounted on the heat sink and connected to the dielectric substrate, said mounting flange having a top surface;
      a plurality of transistors mounted on the top surface of the mounting flange, each of said transistors having an input terminal, an output terminal, and a ground terminal, said ground terminal of each transistor being electrically coupled to the top surface of the mounting flange;
      a first ground signal return path electrically coupling the top surface of the mounting flange to the reference ground plane; and
      a second around signal return path electrically parallel to the first path and physically isolated therefrom, said second path electrically coupling the top surface of the mounting flange to the dielectric substrate;
   wherein, said second signal return path reduces losses associated with the first path caused by resistance due to skin effect.

15. The assembly of claim 14 wherein the conductive mounting flange of the LDMOS power package includes sides that extend downward through the PC board to the dielectric substrate and the heat sink, and the first ground signal return path extends from the ground terminal of each transistor, across the top surface of the mounting flange, down the sides of the mounting flange, and through the dielectric substrate.

16. The assembly of claim 15 wherein the conductive top surface of the PC board carries input signals to the input terminals of the transistors, and carries output signals from the output terminals of the transistors, and the LDMOS power package further comprises:
   at least one ground lead frame electrically coupling the top surface of the mounting flange to a ground pad formed in the top surface of the PC board, said ground pad being electrically isolated from the top surface of the PC board by an area surrounding the ground pad in which the top surface of the PC board has been removed; and
   a conductive via extending downward through the PC board and electrically coupling the ground pad to the dielectric substrate.

17. The assembly of claim 16 wherein the second ground signal return path extends from the ground terminal of each transistor, across the top surface of the mounting flange, through the ground lead frame, through the ground pad, arid through the conductive via to the dielectric substrate.

18. The assembly of claim 17 wherein the PC board is cut away in an area surrounding the conductive mounting flange, and the conductive via is adjacent the cut-away area and separated from the mounting flange by the cut-away area, and the LDMOS power package further comprises at least one bond wire spanning the cut-away area, and electrically coupling the top surface of the mounting flange directly to the conductive via.

19. The assembly of claim 18 further comprising a third ground signal return path in parallel with the first and second paths, said third path extending from the ground terminal of each transistor, across the top surface of the mounting flange, through the bond wire, and through the conductive via to the dielectric substrate.

20. The assembly of claim 15 wherein the conductive top surface of the PC board carries input signals to the input terminals of the transistors, and carries output signals from the output terminals of the transistors, and the LDMOS power package further comprises:
   at least one ground lead frame electrically coupling the top surface of the mounting flange to a ground pad formed in the top surface of the PC board, said ground pad being electrically isolated from the top surface of the PC board by an area surrounding the ground pad in which the top surface of the PC board has been removed; and
   an extension of the conductive metal heat sink extending upward through the PC board and electrically coupling the ground pad to the metal heat sink.

21. The assembly of claim 20 wherein the second ground signal return path extends from the ground terminal of each transistor, across the top surface of the mounting flange, through the ground lead frame, through the ground pad, and through the extension of the heat sink to the conductive metal heat sink.

* * * * *